(12) United States Patent
Kubena et al.

(10) Patent No.: US 8,305,154 B1
(45) Date of Patent: Nov. 6, 2012

(54) PARAMETRICALLY DRIVEN QUARTZ UHF OSCILLATOR

(75) Inventors: Randall Kubena, Oak Park, CA (US); Yook-Kong Yong, Princeton, NJ (US)

(73) Assignee: HRL Laboratories, LLC, Malibu, CA (US)

(*) Notice: Subject to any disclaimer, the term of this patent is extended or adjusted under 35 U.S.C. 154(b) by 27 days.

(21) Appl. No.: 12/954,475

(22) Filed: Nov. 24, 2010

Related U.S. Application Data

(63) Continuation-in-part of application No. 12/835,610, filed on Jul. 13, 2010.

(51) Int. Cl.
*H03B 5/32* (2006.01)
*H01L 41/047* (2006.01)
*H01L 41/083* (2006.01)

(52) U.S. Cl. ........ 331/163; 331/154; 310/320; 310/321; 310/333; 310/361; 310/366

(58) Field of Classification Search .......... 310/311, 310/320, 321, 333, 360, 361, 363, 365, 366; 331/116 FE, 116 M, 116 R, 154, 163; 333/219, 333/219.1
See application file for complete search history.

(56) References Cited

U.S. PATENT DOCUMENTS

| | | | |
|---|---|---|---|
| 3,012,204 A | | 12/1961 | Dransfeld et al. |
| 3,401,354 A | | 9/1968 | Seidel |
| 3,816,753 A | | 6/1974 | Kino |
| 4,320,320 A | | 3/1982 | Momosaki et al. |
| 4,419,600 A | * | 12/1983 | Sinha ............................ 310/361 |
| 4,544,897 A | * | 10/1985 | Ishikawa .................... 331/116 R |
| 4,872,765 A | * | 10/1989 | Schodowski .................. 374/117 |
| 5,652,556 A | * | 7/1997 | Flory et al. ................... 333/219.1 |
| 5,912,594 A | * | 6/1999 | Burkhard ................... 331/116 R |
| 5,966,053 A | * | 10/1999 | Durig et al. .............. 331/116 M |
| 7,459,099 B2 | | 12/2008 | Kubena et al. |
| 2007/0176701 A1 | * | 8/2007 | Nakamura et al. ............ 331/154 |
| 2011/0260802 A1 | * | 10/2011 | Villanueva Torrijo et al. ............................ 331/156 |

OTHER PUBLICATIONS

U.S. Appl. No. 12/835,610 "Piezoelectric Resonator Configured for Parametric Amplification", Randall L. Kubena, et al., Application & Office Actions.

* cited by examiner

*Primary Examiner* — Levi Gannon
(74) *Attorney, Agent, or Firm* — George R. Rapacki; Daniel R. Allemeier

(57) ABSTRACT

The present invention is a piezoelectric crystal oscillator using parametric amplification to enhance the Q. Parametric amplification is accomplished by driving the same region of the crystal as used for the oscillator with an overtone of the crystal resonator.

18 Claims, 8 Drawing Sheets

101 shear direction for AT cut crystal
102 shear direction for SC cut crystal

PARAMETRICALLY DRIVEN QUARTZ UHF OSCILLATOR

This application is a continuation in part of pending application Ser. No. 12/835,610 file Jul. 13, 2010 titled Piezoelectric Resonator Configured for Parametric Amplification. application Ser. No. 12/835,610 is incorporated by reference herein.

STATEMENT REGARDING FEDERALLY SPONSORED RESEARCH OR DEVELOPMENT

This invention was made with Government support under Contract No. HR001-10-C-0109 Dynamically-Enhanced Quartz Reference Oscillators DARPA/MTO. The Government has certain rights in this invention.

FIELD OF THE INVENTION

The present invention relates to the structure and fabrication of parametrically driven quartz oscillators.

BACKGROUND OF THE INVENTION

Parametric amplification is a well known technique for increasing the Q of electronic oscillators whereby the stiffness of the system (the capacitance of an electrical oscillator or the elastic constant for a mechanical oscillator) is modulated at twice the natural resonant frequency. This overtone modulation can be shown to significantly increase the amplitude of the forced oscillator resonance, thereby effectively increasing the Q. A limitation on this technique for low frequency oscillators is the voltages of the resonating and the parametric amplification circuits are inversely proportional to frequency. Several groups have recently demonstrated this effect for MEMS-based Si resonators using thermally (laser) induced changes in the elastic modulus or specially designed springs near the active resonator. However, no attempt has been reported to apply this technique to piezoelectric shear-mode quartz resonators.

The prior art does not use parametric amplification at twice the resonant frequency for a quartz oscillator. Moreover, quartz oscillators in the 5-10 MHz range have traditionally been manufactured as discrete HF devices packaged in large ceramic packages, where the ability to modulate the elastic modulus with low drive voltages has been limited because the voltages needed for parametric amplification are often larger than the saturation values for small low noise circuits. This limits the level of integration achievable. Dransfeld, in Elastic Wave Parametric Amplifier U.S. Pat. No. 3,012,204, describes parametric amplification in quartz but not as an oscillator nor is the pump frequency twice the resonator frequency. Seidel, in Frequency Stabilized Oscillator U.S. Pat. No. 3,401,354, describes paralleling several discrete crystal oscillators of distinct frequencies and exploiting the parametric amplification of each oscillator by pumping each with a composite signal. Kano, in Parametric Acoustic Surface Wave U.S. Pat. No. 3,816,753, describes an oscillator based on counter propagating surface acoustic waves instead of the natural resonance of the crystal. Finally, Momosaki in Coupled Mode Tuning Fork Type Quartz Crystal Vibrator U.S. Pat. No. 4,320,320 couples one tine in a flexural mode at one frequency with another tine in a torsional mode at a frequency not an integer multiple of the first frequency.

There is a continuing need for VHF and UHF oscillators that operate with voltages that are compatible with CMOS electronics, are thermally stable and generate low noise.

SUMMARY OF THE INVENTION

In one embodiment of the invention, an oscillator device comprising: a slab of piezoelectric material with a first frequency of a mechanical mode of vibration;
a first drive electrode disposed on an upper surface of the slab and a second drive electrode disposed on a lower surface of the slab opposite the first drive electrode;
a first amplifier operating at substantially an integer multiple of the first frequency;
an input of a second amplifier connected to the first drive electrode and an output of the second amplifier connected to an input of the first amplifier;
the second drive electrode connected to the sum of an output of the first amplifier and the output of the second amplifier.

The previous embodiment wherein the first amplifier operates substantially at twice the first frequency. Furthermore, the first amplifier may further comprise a bandpass filter with a center frequency substantially equal to the first frequency, an output of the bandpass filter may be connected to an input of a frequency multiplier, and the frequency multiplier may be configured to generate an output at a multiple of the first frequency wherein the input of the first amplifier is connected to an input of the bandpass filter. The bandpass filter may be an integrated monolithic crystal filter formed on the slab of piezoelectric material. The bandpass filter may comprise electrodes disposed on the slab near the first drive electrode and second drive electrode.

The first amplifier of the previous embodiment may further comprise a phase shifter connected to the output of the frequency multiplier wherein the output of the phase shifter is connected to the output of the first amplifier.

The piezoelectric material of the previous embodiments may be selected from the group consisting of quartz, langasite, langanite and langatate. The piezoelectric material may be selected from the group comprising AT-cut quartz and SC-cut quartz. Furthermore, the mode of mechanical vibration may be a shear mode and the frequency of the mechanical mode of vibration may be greater than 50 MHz.

Another embodiment of the invention may comprise a piezoelectric resonator configured for parametric amplification, said piezoelectric resonator may comprise a piezoelectric member, first and second resonator electrodes associated with said piezoelectric member and positioned to enable a first electric field to be generated in a first direction, and first and second parametric drive electrodes associated with said piezoelectric member and positioned to enable a second electric field to be generated in said first direction and coincident with said first electric field.

The piezoelectric resonator of the previous wherein the resonator has a resonant frequency equal to a frequency of a mechanical mode of vibration; and the first electric field oscillates at the frequency of the mechanical mode of vibration; and the second electric field oscillates at a frequency a multiple of the frequency of the mechanical mode of vibration.

In another embodiment of the invention, an oscillator device comprising a slab of piezoelectric material with a first frequency of a mechanical mode of vibration, a first means for driving the piezoelectric material at the first frequency, and a second means for driving the piezoelectric material at an integer multiple of the first frequency. The oscillator of the previous embodiment wherein the second means for driving the piezoelectric material further comprises means for receiving an output of the first means for driving the piezoelectric material, means for bandpass filtering the output of the first means for driving the piezoelectric material, means for frequency multiplying an output of the bandpass filter by the integer number, and means for phase shifting an output of the means for frequency multiplying. Furthermore, the integer multiple may be two, the piezoelectric material is selected from the group consisting of quartz, langasite, langanite and langatate, or the piezoelectric material may be selected from the group comprising AT-cut quartz and SC-cut quartz. The oscillator of the previous embodiment wherein the mode of mechanical vibration is a shear mode and the first frequency of a mechanical mode of vibration may be greater than 50 MHz.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
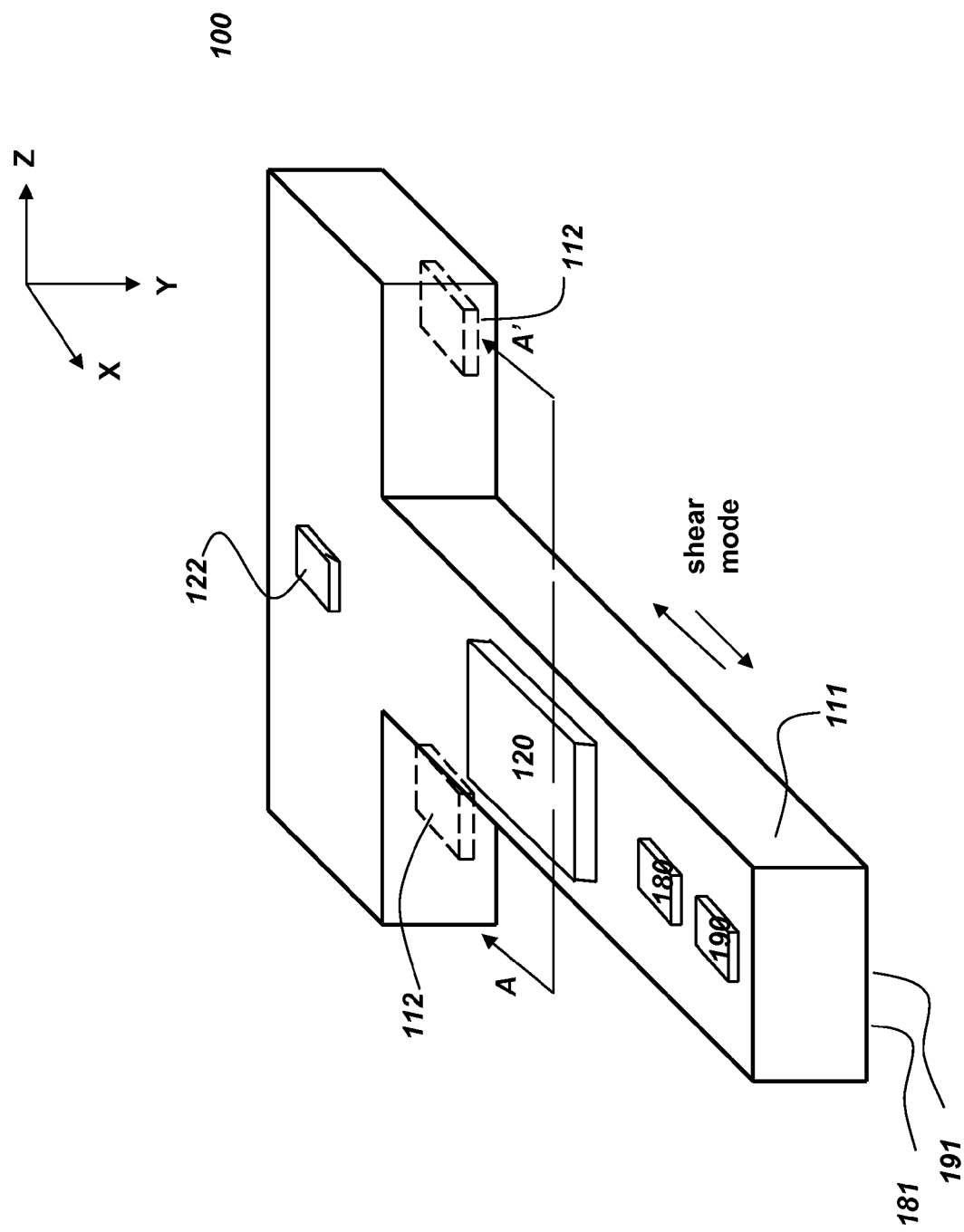
FIG. 1 illustrates the resonator structure, associated vias and bonding pads and the direction of shear.

Although embodiments of the present invention are applicable to many different devices, they are particularly applicable to piezoelectric crystal oscillators.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

It is also understood that when an element such as a layer, region or substrate is referred to as being "on" another element, it can be directly on the other element or intervening elements may also be present. Furthermore, relative terms such as. "inner", "outer", "upper", "above", "lower", "beneath", "below", and similar terms, may be used herein to describe a relationship of one layer or another region. It is understood that these terms are intended to encompass different orientations of the device in addition to the orientation depicted in the figures.

Embodiments of the invention are described herein with reference to cross-sectional view illustrations that are schematic illustrations of idealized embodiments of the invention. It is understood that many of the layers will have different relative thicknesses compared to those shown. Further, variations from the shapes of the illustrations as a result, for example, of manufacturing techniques and or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The problems previously described are at least partially solved by driving the same volume of crystal used for the resonator with a parametric drive signal at an overtone at twice the fundamental frequency. The result is the modulation of the elastic modulus with low drive voltages and the increase in the Q of the device.

In one aspect of the invention the same volume of piezoelectric material driven by a resonator circuit as part of an oscillator may also be driven by a parametric amplifier circuit at twice the resonator frequency.

In order to achieve parametric amplification in quartz resonators with electrostatic methods, a high stress must be applied to modulate the elastic modulus through nonlinear effects. This stress is very effectively produced using the inherent piezoelectric properties of quartz, for example. Other mechanical strain driven techniques typically will not produce the required uniform strain in the active regions at RF frequencies. Moreover, for commercial HF resonators, the thickness of the quartz is greater than 50 microns which then requires large voltages (greater than 3 V) to be applied if adequate modulation of the elastic modulus is to be achieved. These relatively high voltages are difficult to produce with Application Specific Integrated Circuits (ASICs) or resonators integrated as part of a larger system, and can produce rather large coupling fields and saturation effects in the resonating circuits. In one aspect of the invention applied to AT-cut quartz crystal resonating in the shear mode, large parametric gain is achieved using sub-0.1 volt signals by applying a field coincident with the electric field of the resonator. For AT-cut quartz crystal, this is along the Y-axis (in the direction of the thickness) of a UHF device.

In one aspect of the invention, and without implying a limitation, a localized high stress may be superimposed directly on the resonator region of the oscillator using a modified conventional resonating circuit such as a Pierce or Colpitts design. Other oscillator designs are possible and within the contemplation of the present invention.

In another aspect of the invention the noise properties of an oscillator may be attenuated by increasing the Q of the oscillator. Q is generally understood as the center frequency of the resonator divided by the resonator's bandwidth. For AT-cut quartz Micro Electromechanical Systems (MEMS) resonators operating at UHF frequencies, parametric amplification may reduce phase noise through an increase in Q, thereby benefitting many applications. For example, low phase noise oscillators are an important component in radar and communication systems. Since the phase noise for close to carrier applications is proportional to $1/Q^2$ at constant frequency, a 10× improvement in Q represents a 100× reduction in phase noise $S_\phi$ or 20 dBc/Hz. This is a significant improvement in phase noise. Thus, Doppler radar and GPS accuracy will improve and communication noise levels near high power transmitters will be reduced. In addition, communication systems can be designed with lower power consumption (systems will have higher noise rejection) which is critical for portable and hand-held devices.

In one aspect of the invention a thermally-compensated piezoelectric quartz resonator structure with high-gain parametric amplification can be achieved at low voltages by superimposing an electric field on the normal resonator electric field between the shear-mode drive electrodes. This superimposed electric field operates at twice the resonant frequency $f_o$. The required voltages may be produced by ASICs and prevents saturation within the resonating circuit, thereby reducing extraneous noise generation. While parametric amplification in this invention is at substantially twice the resonant frequency, it is within the scope of this invention to select a frequency for parametric amplification wherein the frequency of parametric amplification divided by two is within a half bandwidth of the resonator frequency $f_o$.

In one aspect of the invention the voltages needed for driving the oscillator and achieving high Q are less than required without parametric amplification.

In another aspect of the invention, alternate materials to quartz are any that are piezoelectric and isomorphs of quartz. For example, and without implying a limitation, Langasite $La_3Ga_5SiO_{14}$, Langanite $La_3Ga_{5.5}Nb_{0.5}O_{14}$ and Langatate $La_3Ga_{5.5}Ta_{0.5}O_{14}$.

The location of the resonant mode drive electrodes on the piezoelectric material follow the standard techniques known in the art for shear mode oscillators. In one aspect of the invention the piezoelectric material is a quartz slab approximately 85 microns long and less than 50 microns thick. In general, the electrodes are located on a cantilevered portion of the slab and about a wavelength away from edges. The resonating volume is confined to the area covered by the electrode so the remaining real estate or area may be used for bandpass filters, dampers and other circuit elements. A preferred embodiment comprises the piezoelectric material cantilevered to improve the thermal stability. If instead of a cantilevered section of the piezoelectric material, the piezoelectric material is attached at more than one location to a substrate, temperature changes can cause variations in the mechanical properties of the piezoelectric material.

Figure 3:
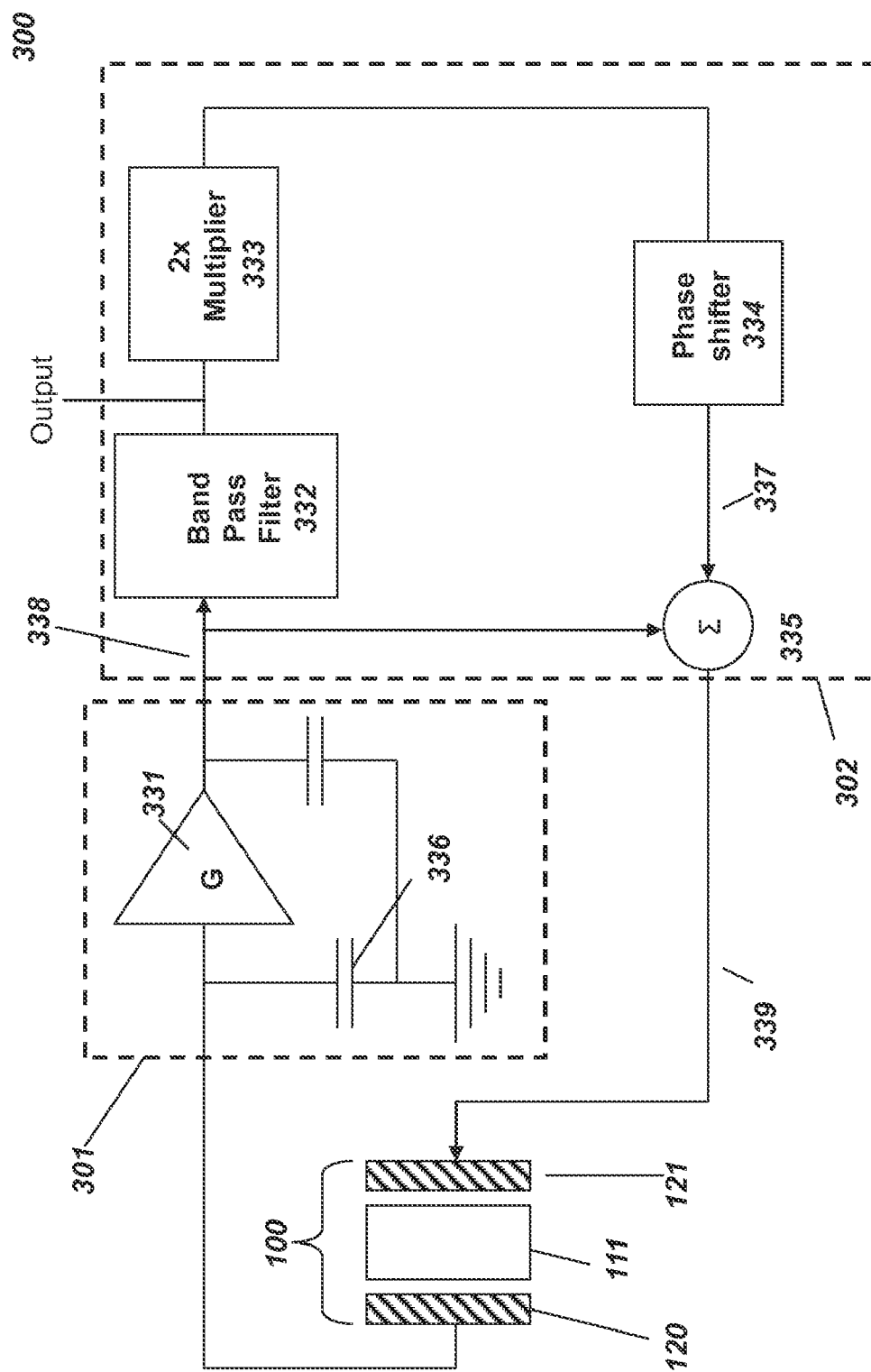
FIG. 3 shows the integration of the resonator in FIG. 1 with a resonator circuit and parametric amplification circuit.

In another aspect of this invention, the technique of driving the same electrodes used for the resonator with a parametric signal at twice the frequency is also applicable when the resonator mode being driven is an overtone, i.e. a multiple of the fundamental mechanical frequency $f_0$. The design shown in FIG. 3 is not specific to a particular resonator mode. The same design will work for higher modes such as the third and fifth overtone. To excite the third overtone, the resonating circuit is designed to oscillate at the frequency of the overtone (e.g. $3f_0$), and the parametric circuit is designed for $6f_0$.

Figure 7:
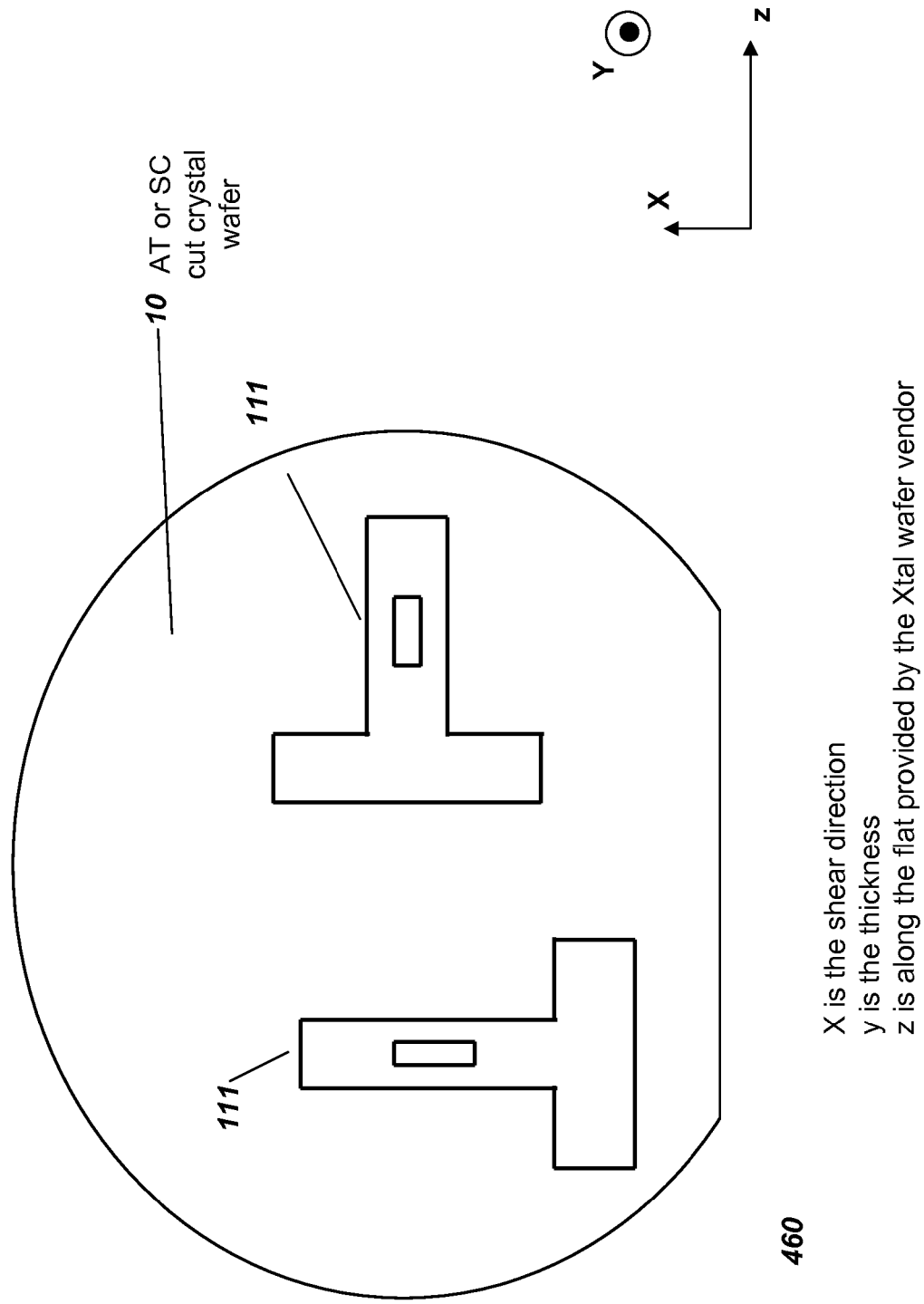
FIG. 7 illustrates the orientation of the resonator on a commercially available wafer.

Crystal wafers supplied by commercial vendors are typically circular with a flat edge defining the Z direction. See FIG. 7 which shows the orientation of the piezoelectric slab 111 on a wafer 10. The thickness is the Y direction, normal to the wafer. The shear direction is normal to the flat and is called the X direction. AT cut crystals have shear direction parallel to the X direction and SC crystals have a shear direction nominally in the X direction but at a slight angle to the X-Z plane. Note that in other configurations the shear direction may be across the piezoelectric slab 111.

Figure 8:
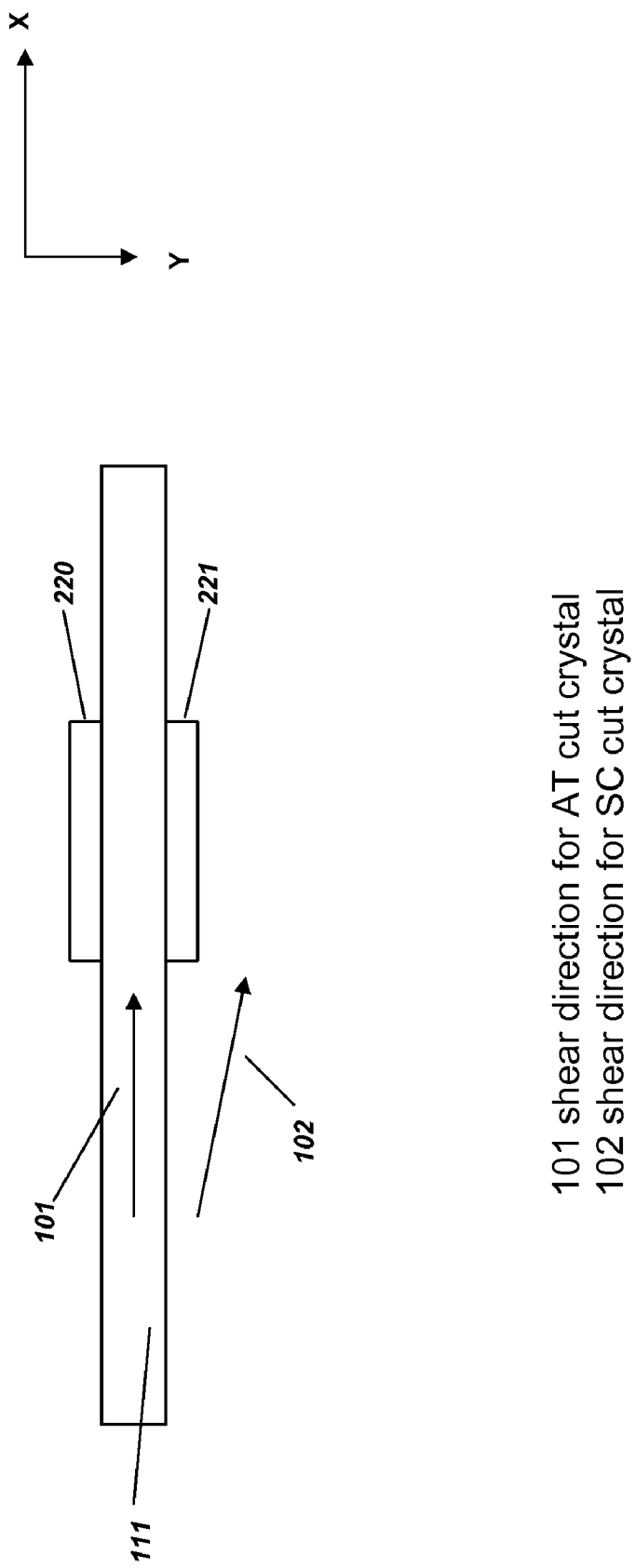
FIG. 8 illustrates the orientation of the shear mode for AT or SC cut crystals.

The same technique and electrodes for AT cut shear mode resonators will work for the cut crystals. FIG. 8 shows the relationship between AT cut crystals and SC cut crystals. For AT cut crystals the shear direction 101 is coincident with the X axis of the wafer. For SC cut crystals the shear direction 102 is at an angle to the X-Z plane.

Other mechanical vibration modes besides shear modes are possible. As long as the electrodes are capable of exciting or driving into resonance a mechanical vibration mode (e.g. the first flexible mode or tuning fork mode) then the same electrodes may be used to parametrically excite that mechanical vibration mode with a parametric amplification signal at twice the resonant frequency.

In general, the size of the cantilevered resonator section is inversely proportional to frequency and, in particular, the thickness is inversely proportional to frequency. In addition, the voltages needed are inversely proportional to frequency. In general, the resonator length and width are inversely proportional to frequency to the power V where $½<V<1$.

Figure 2:
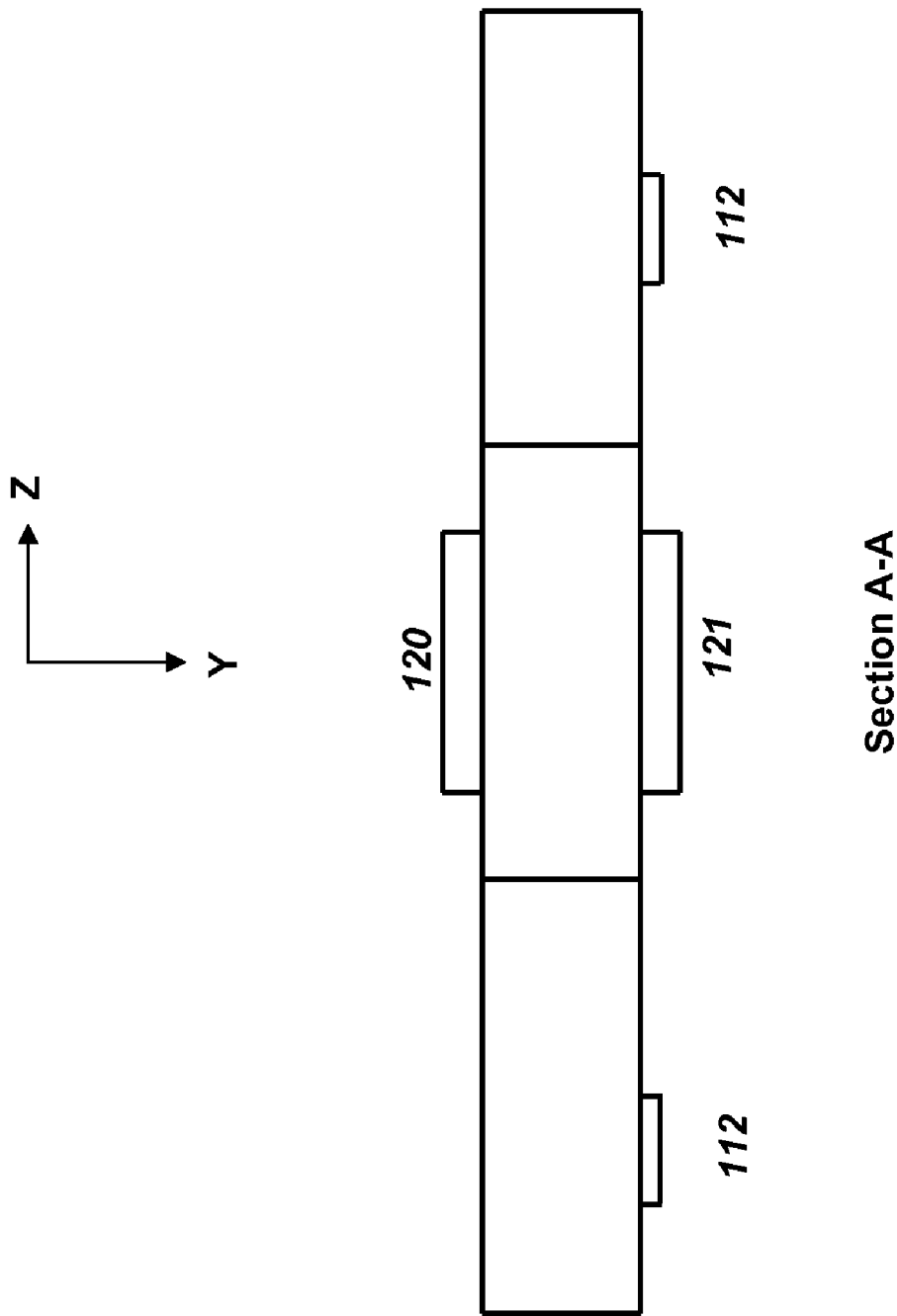
FIG. 2 is a cross section of the resonator shown in FIG. 1.

One aspect of the parametric oscillator invention is shown in FIGS. 1 and 2. FIG. 2 shows a cross sectional view along the line A-A' in FIG. 1. In this embodiment an Ultra High Frequency (UHF) shear-mode resonator 100 (using AT or SC cut quartz or other piezoelectric material) is constructed per the process described in Quartz-Based Nanoresonators and Method for Fabricating Same U.S. Pat. No. 7,459,099 (incorporated by reference in its entirety) or its equivalent with top 120 and bottom 121 electrodes located on opposite faces of the slab 111 of piezoelectric material, as shown in FIG. 2. For AT-cut quartz, these faces are the Y-axis faces. These electrodes 120 and 121 supply the drive voltage to excite resonance within a resonating circuit such as a Pierce or Colpitts circuit. Other circuits are possible. No limitation is implied by the inclusion of Pierce and Colpitts circuits.

FIG. 1 shows the orientation of the piezoelectric material and the direction of the shear mode of oscillation. FIG. 1 also shows electrodes 180 and 190 and indicates the presence of electrodes 181 and 191 on the underside of the slab 111. Electrodes 181 and 191 are opposite electrodes 180 and 190, respectively. Electrodes 180, 181, 190, 191 may be used for capacitive sense or force rebalance functions or others, as needed. In addition, the location of the electrodes 180, 181, 190 and 191 are not limited to the locations shown in FIG. 1. Other locations are possible depending on the function needed. For example, one or more of these electrodes may be located on the X axis or Z axis faces of the slab 111 or near the pads 112.

The resonator 100 in FIG. 1 is combined with circuitry in FIG. 3 to form an oscillator 300. The circuit comprises a drive amplifier 301 and a parametric amplifier 302. In one embodiment the drive amplifier 301 comprises capacitors 336, amplifier 331 and resonator 100. The drive amplifier 301 generates the fundamental frequency signal 338. The resonator 100 comprises electrodes 120 and 121 that are connected as shown in FIG. 3. As is known, this makes the piezoelectric material of the slab 111 between the electrodes 120 and 121 into a resonator. The parametric drive amplifier 302 comprises a bandpass filter 332 a frequency multiplier 333 an optional phase shifter 334 and a summer 335. The parametric drive amplifier 302 accepts the fundamental frequency 338 as an input and generates the Output of the oscillator and drive signal 339. The drive signal 339 is a combination of the fundamental frequency signal 338 and the parametric amplification signal 337. In one embodiment, the combination of the fundamental frequency signal 338 and the parametric amplification signal 337 is a summation of the two signals. As shown in FIG. 3, the parametric amplification signal 337 is generated by tapping the fundamental frequency signal 338 on the output of the resonating circuit 301, frequency multiplying by a factor of approximately two and optionally phase shifting as needed to ensure the appropriate phase to satisfy the Mathieu equation for parametric gain. The band pass filter 332 is used to tap the fundamental frequency signal 338 so that the frequency multiplier 333 does not multiply the parametric amplification signal 337. The parametric amplification signal 337 must be large enough to satisfy the Mathieu equation for parametric gain. Since the parametric amplification signal 337 does not pump a mechanical high gain mode of the system (because the high gain modes are odd harmonics of the fundamental signal frequency $f_o$), parametric amplification will not result in unbounded positive feedback. Furthermore, if the parametric amplification signal 337 is small enough to prevent nonlinear saturation of the amplifier 331 in the resonating circuit 301, it will not contribute to excess noise in the system 300 over the inherent 6 dB of noise added by a noise-free 2× multiplier 333 and phase shifter 334.

The modified Pierce oscillator circuit shown in FIG. 3 illustrates one preferred embodiment of the integration of the resonator 100 with the resonator and parametric amplification circuit elements. In alternative embodiments similar circuit modifications can be used for other resonating circuits such as the Colpitts or Clapp circuits. One advantage of the preferred embodiment in FIG. 3 is it minimizes the voltage required and provides a straight forward extension of current designs. For an applied voltage of 60 mV and 1 GHz design, non-linear simulations predict the peak shear modulus relative change $\Delta k/k$ will be $1.5 \times 10^{-4}$ for AT-cut quartz. According to Mathieu's equation, the parametric resonance condition is met when $\Delta k/k = 2/Q$, where Q is the initial Q of the resonator. Hence this level of parametric drive is sufficient to produce a high Q amplification when the initial Q is near 13300.

Figure 5:
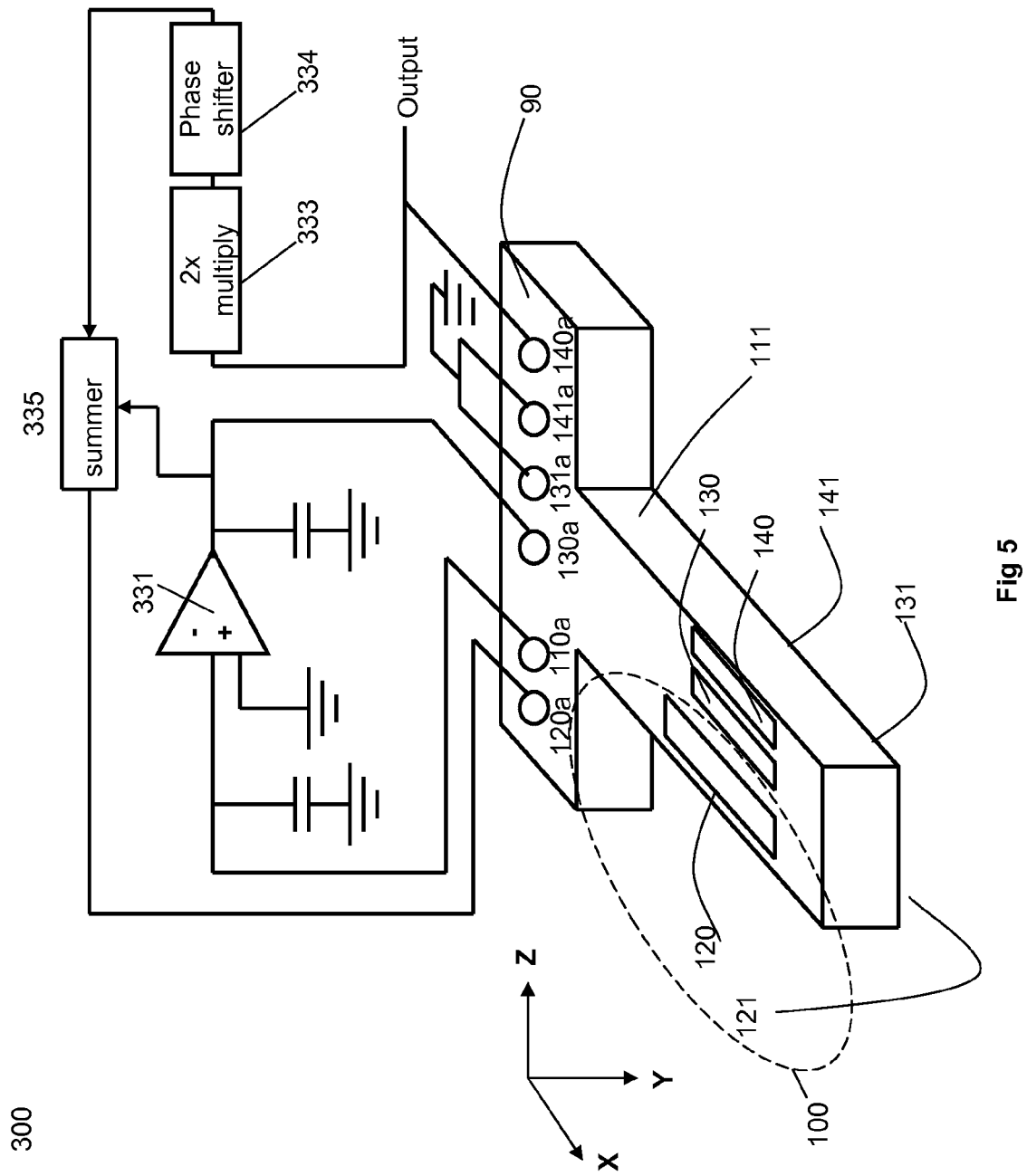
FIG. 5 illustrates an alternative embodiment where the resonator includes a band pass filter in close thermal proximity.

Continuing with the description of FIG. 3, the parametric amplification signal 337 generated by the multiplier 333 can be added to the fundamental frequency signal 338 from the resonating circuit 301 using a summing junction 335. Without implying a limitation, this summing junction 335 can be implemented using a well known non-inverting summer circuit, among other embodiments. This summer junction 335 may attenuate the frequency doubled signal 337 that is passed back into the resonating circuit. Since the band pass filter 332, multiplier 333, and phase shifter 334 are all located outside the resonating circuit 301 control loop, no excess noise or phase shifts are introduced within the loop itself. In addition, for a high level of integration, the band pass filter 332 may be fabricated on the same piezoelectric slab 111 to provide a monolithic crystal band pass filter 332 at the same center frequency as the fundamental mode of the oscillator 300. This embodiment is illustrated in FIG. 5 where filter 332 is formed of the electrodes 130, 131, 140 and 141 and connected to the rest of the oscillator 300 through pads 103a, 131a, 140a, 141a. An advantage of this aspect of the invention is the resonator 100 and band pass filter 332 have the same thermal environment and hence the same mechanical properties.

Figure 4:
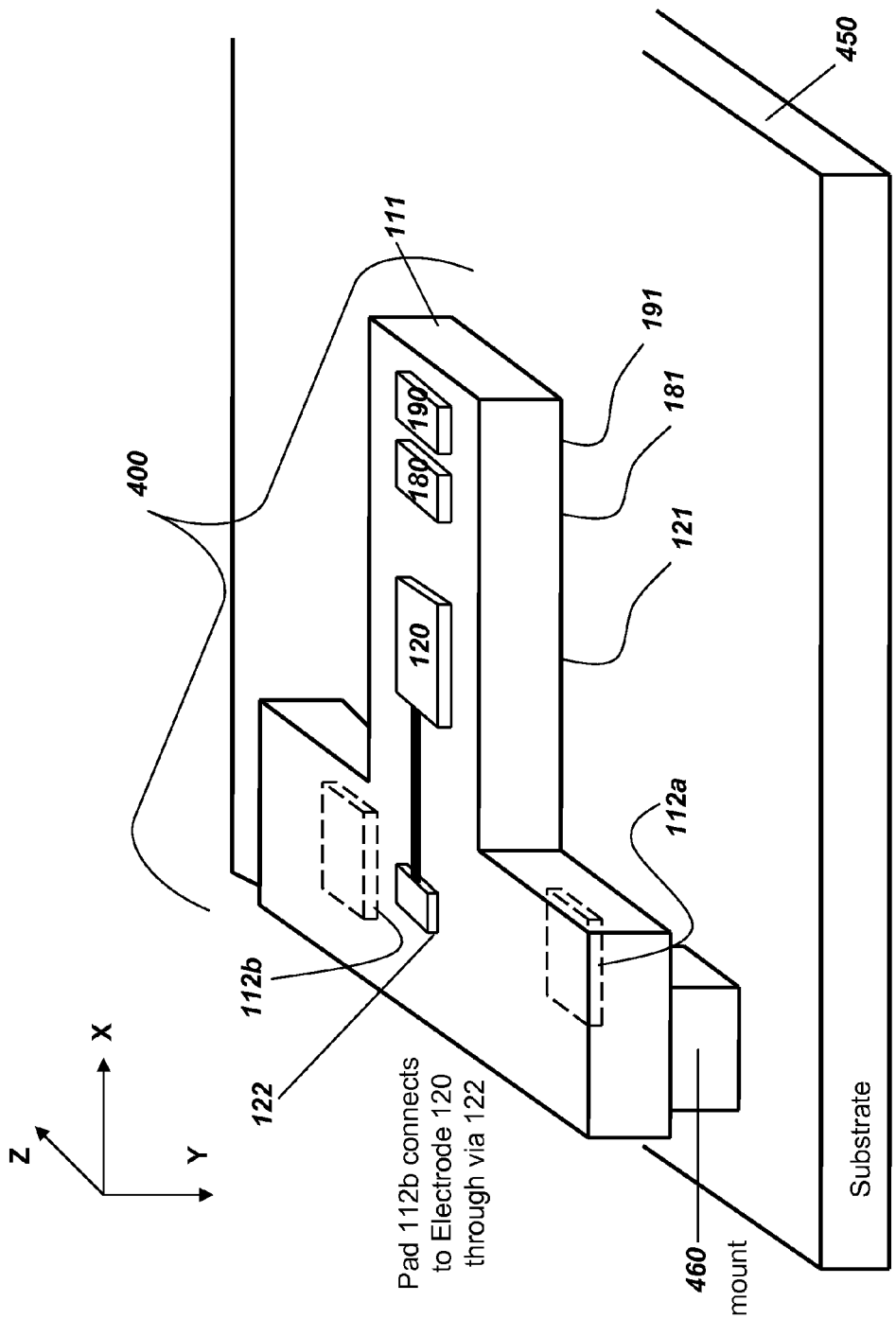
FIG. 4 illustrates the integration of the resonator of FIG. 1 with a substrate and mounting.

FIG. 4 shows an aspect of the invention for reducing thermal sensitivity where the resonator 400 is mounted on one or more structures 460 to cantilever the resonator 400 and thereby thermally isolate the piezoelectric slab 111 from the substrate 450. This embodiment also provides a mechanically uniform and stable (with respect to temperature variations) parametrically driven stress region between the electrodes 120 and 121. This aspect of the invention may require more than one through via 122 to allow connections to the top electrodes 120, 180 and 190. The pads and vias for connecting to electrodes 180 and 190 are not shown but are similar to that for electrode 120. Similarly, electrodes 120, 180, 190 have corresponding opposite electrodes 121, 181 and 191 not visible in FIG. 4 but present on the underside of the piezoelectric slab 111 to complete the resonator 400, capacitive sense and force rebalance electrode sets.

FIG. 5 shows an aspect of the invention with the bandpass filter 332 integrated with the resonator 100 and parametric amplification circuitry. In FIG. 5 the resonator 100 is formed from the electrodes 120 and 121. Electrode 121 is on the underside of the piezoelectric slab 111 opposite electrode 120. The bandpass filter 332 is formed from electrodes 130, 131, 140 and 141. The connections between the electrodes 120, 121, 130, 131, 140 and 141 and the circuitry are made through pads 120a, 121a, 130a, 131a, 140a, 141a and vias as necessary. Electrodes 131 and 141 are on the underside of piezoelectric slab 111 and opposite electrodes 130 and 140 respectively, although the precise placement may be altered as those skilled in the art will appreciate. FIG. 5 shows that more than one component may be fabricated on the piezoelectric slab 111. In other aspects of the invention, the piezoelectric slab 111 may host more than two devices, including devices for damping.

An integrated device 300 as shown in FIG. 5 may have excitation and sense electrodes in the same region as the resonating and parametric excitation electrodes for thermal stability. For example, bandpass filter electrodes 130, 131, 140 and 141 may be fabricated near resonator electrodes 120 and 121, so that the thermal drift of the bandpass filter 332 center frequency matches that of the resonator 100.

Figure 6:
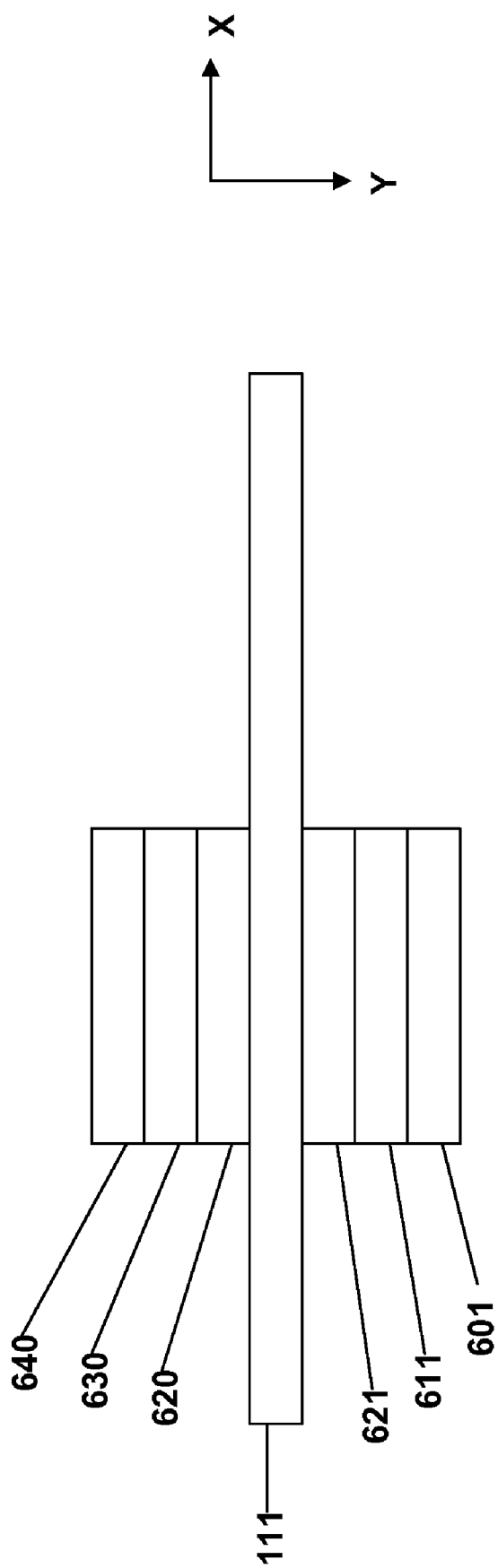
FIG. 6 illustrates an alternative embodiment of the resonator of the present invention with an alternative arrangement of resonator and parametric amplification electrodes.

There are other multiple electrode embodiments which could provide a parametric amplifying electric field at twice the resonant frequency to the shear-mode resonant frequency drive region. One aspect of the invention is to superimpose the resonant frequency drive electric field on the twice resonant frequency parametric drive electric field in the active region. One advantage of this is the elimination of the summer circuit 335 in FIG. 3. An example of this alternative arrangement is shown in FIG. 6. In FIG. 6 the resonator electrodes 620 and 621 are overlaid with dielectric layer 630 and 611 respectively and the parametric amplifier electrodes 640 and 601 are disposed on the dielectric layers 630 and 611 respectively. One benefit of this arrangement is the summer circuit 335 in FIG. 5 may be eliminated. In an alternative embodiment, the parametric drive electrodes 640 and 601 are disposed on the piezoelectric slab 111, the dielectric layers 630 and 611 are disposed on the parametric drive electrodes 640 and 601 and the resonator electrodes 620 and 621 are disposed on the dielectric layers 630 and 611.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

We claim:

1. An oscillator device comprising:
    a slab of piezoelectric material with a first frequency of a mechanical mode of vibration;
    a first drive electrode disposed on an upper surface of the slab and a second drive electrode disposed on a lower surface of the slab opposite the first drive electrode;
    a first amplifier operating at substantially an integer multiple of the first frequency;
    an input of a second amplifier connected to the first drive electrode and an output of the second amplifier connected to an input of the first amplifier;
    the second drive electrode connected to the sum of an output of the first amplifier and the output of the second amplifier.

2. The oscillator of claim 1 wherein the first amplifier operates substantially at twice the first frequency.

3. The oscillator of claim 1 wherein the first amplifier comprises:
    a bandpass filter with a center frequency substantially equal to the first frequency;
    an output of the bandpass filter is connected to an input of a frequency multiplier; and the frequency multiplier configured to generate an output at a multiple of the first frequency;
wherein the input of the first amplifier is connected to an input of the bandpass filter.

4. The oscillator of claim 3 wherein the first amplifier further comprises a phase shifter connected to the output of the frequency multiplier;
wherein the output of the phase shifter is connected to the output of the first amplifier.

5. The oscillator of claim 1 wherein the piezoelectric material is selected from the group consisting of quartz, langasite, langanite and langatate.

6. The oscillator of claim 1 wherein the piezoelectric material is selected from the group comprising an AT-cut quartz and a SC-cut quartz.

7. The oscillator of claim 1 wherein the mode of mechanical vibration is a shear mode.

8. The oscillator of claim 7 wherein the first frequency of a mechanical mode of vibration is greater than 50 MHz.

9. The oscillator of claim 1 wherein the bandpass filter is an integrated monolithic crystal filter formed on the slab of piezoelectric material.

10. The oscillator of claim 3 wherein the bandpass filter comprises electrodes disposed on the slab near the first drive electrode and second drive electrode.

11. A piezoelectric resonator configured for parametric amplification, said piezoelectric resonator comprising:
a piezoelectric member;
a first and second resonator electrodes associated with said piezoelectric member and positioned to enable a first electric field to be generated in a first direction; and first and second parametric drive electrodes associated with said piezoelectric member and positioned to enable a second electric field to be generated in said first direction and coincident with said first electric field.

12. The piezoelectric resonator of claim 11 wherein the resonator has a resonant frequency equal to a frequency of a mechanical mode of vibration; and
the first electric field oscillates at the frequency of the mechanical mode of vibration; and
the second electric field oscillates at a frequency a multiple of the frequency of the mechanical mode of vibration.

13. An oscillator device comprising:
a slab of piezoelectric material with a first frequency of a mechanical mode of vibration;
a first means for driving the piezoelectric material at the first frequency; and
a second means for driving the piezoelectric material at an integer multiple of the first frequency
wherein the second means for driving the piezoelectric material further comprises means for receiving an output of the first means for driving the piezoelectric material;
means for bandpass filtering the output of the first means for driving the piezoelectric material;
means for frequency multiplying an output of the bandpass filter by the integer number; and
means for phase shifting an output of the means for frequency multiplying.

14. The oscillator of claim 13 wherein the integer multiple is two.

15. The oscillator of claim 13 wherein the piezoelectric material is selected from the group consisting of quartz, langasite, langanite and langatate.

16. The oscillator of claim 13 wherein the piezoelectric material is selected from the group comprising an AT-cut quartz and a SC-cut quartz.

17. The oscillator of claim 13 wherein the mode of mechanical vibration is a shear mode.

18. The oscillator of claim 13 wherein the first frequency of a mechanical mode of vibration is greater than 50 MHz.

* * * * *